US009391617B2

(12) United States Patent  
Mathew et al.

(10) Patent No.: US 9,391,617 B2  
(45) Date of Patent: Jul. 12, 2016

(54) HARDWARE-EMBEDDED KEY BASED ON RANDOM VARIATIONS OF A STRESS-HARDENED INEGRATED CIRCUIT

(71) Applicant: Intel Corporation, Santa Clara, CA (US)

(72) Inventors: Sanu K. Mathew, Hillsboro, OR (US); Rachael J. Parker, Forest Grove, OR (US); Ram K. Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 125 days.

(21) Appl. No.: 13/889,849

(22) Filed: May 8, 2013

(65) Prior Publication Data

US 2014/0266297 A1    Sep. 18, 2014

Related U.S. Application Data

(60) Provisional application No. 61/801,981, filed on Mar. 15, 2013.

(51) Int. Cl.
  *H03K 19/003* (2006.01)
(52) U.S. Cl.
  CPC .... *H03K 19/00369* (2013.01); *H03K 19/00315* (2013.01)
(58) Field of Classification Search
  USPC ............. 326/9–10, 14–15, 59–60, 93–95, 98
  See application file for complete search history.

(56) References Cited

U.S. PATENT DOCUMENTS

| | | | |
|---|---|---|---|
| 4,634,905 | A | 1/1987 | Campbell, Jr. |
| 5,455,931 | A | 10/1995 | Camporese et al. |

(Continued)

FOREIGN PATENT DOCUMENTS

| | | |
|---|---|---|
| JP | 2005-065044 A | 3/2005 |
| WO | 2014/127358 A1 | 8/2014 |

OTHER PUBLICATIONS

Liang et al., "Mitigating the Impact of Process Variations on Processor Register Files and Execution Units", 39th Annual IEEE/ACM International Symposium on Microarchitecture, Dec. 9-13, 2006, 11 pages.

Cowley, et al., "Methods and Systems to Stress-Program an Integrated Circuit", U.S. Appl. No. 13/768,411, filed Feb. 15, 2013, 46 pages.

Office Action received for Taiwan Patent Application No. 103102500, mailed on Aug. 4, 2015, 5 pages of Taiwan Office Action and 1 page of Search Report.

(Continued)

*Primary Examiner* — Douglas W Owens  
*Assistant Examiner* — James H Cho  
(74) *Attorney, Agent, or Firm* — Garrett IP, LLC

(57) ABSTRACT

An IC cell designed to assert one of multiple possible output states, each with equal probability, implemented to assert a pre-determined one of the multiple output states based on random variations within the IC cell, such as random process variations. An array of IC cells is configurable to provide a hardware-embedded key upon power-up that is unique to the combination of random variations of selected IC cells, resistant to tampering prior to and during manufacture, and tolerant to aging, instantaneous thermal noise, and environmental variations, such as voltage and temperature fluctuations. The key may be used as, without limitation, a Platform Root Key, a High-Bandwidth Digital Content Protection (HDCP) key, an Enhanced Privacy Identification (EPID) key, and/or an Advanced Access Content System (AACS) key. Also disclosed are techniques to measure stability and stress-harden an IC cell based on output states of the IC cell.

27 Claims, 15 Drawing Sheets

(56) References Cited

U.S. PATENT DOCUMENTS

| | | | |
|---|---|---|---|
| 5,650,971 | A | 7/1997 | Longway et al. |
| 5,986,473 | A * | 11/1999 | Krishnamurthy et al. ...... 326/83 |
| 6,462,998 | B1 | 10/2002 | Proebsting |
| 6,549,040 | B1 * | 4/2003 | Alvandpour et al. ........... 326/98 |
| 6,906,962 | B2 | 6/2005 | Layman et al. |
| 7,402,855 | B2 | 7/2008 | Kurjanowicz |
| 7,439,775 | B2 * | 10/2008 | Sohn ............................. 327/55 |
| 7,508,694 | B2 | 3/2009 | Terzioglu et al. |
| 7,688,648 | B2 | 3/2010 | Kim |
| 7,759,970 | B2 | 7/2010 | Terzioglu et al. |
| 8,179,160 | B1 | 5/2012 | Chauhan et al. |
| 8,334,715 | B1 | 12/2012 | Muthali et al. |
| 9,018,975 | B2 | 4/2015 | Cowley et al. |
| 2006/0061388 | A1 | 3/2006 | Kuang et al. |
| 2006/0238266 | A1 | 10/2006 | Harjani et al. |
| 2007/0035331 | A1 * | 2/2007 | Pant ................... H03K 19/0963 326/95 |
| 2008/0250290 | A1 | 10/2008 | Bushard et al. |
| 2008/0310243 | A1 * | 12/2008 | Jung et al. ..................... 365/203 |
| 2010/0331024 | A1 | 12/2010 | Wilska et al. |

OTHER PUBLICATIONS

Holcomb, et al., "Power-Up SRAM State as an Identifying Fingerprint and Source of True Random Numbers", IEEE Transactions on Computers, vol. 58, No. 9, Sep. 2009, pp. 1198-1210.
Liu et al., "OxID: On-Chip One-Time Random ID Generation using Oxide Breakdown", 2010 Symposium on VLSI Circuits/Technical Digest of Technical Papers, 2010, pp. 231-232.
International Preliminary Report on Patentability and Written Opinion received for PCT Patent Application No. PCT/US2014/016904, mailed on Aug. 27, 2015, 8 pages.
International Search Report and Written Opinion received for PCT Patent Application No. PCT/US2014/016904, mailed on Jun. 19, 2014, 11 pages.
Stanzione, et al., "Silicon Physical Unclonable Function resistant to a 1025-trial brute force attack in 90 nm CMOS", Conference Paper, 2009 Symposium on VLSI Circuits Digest of Technical Papers, Jul. 2009, pp. 116-117.
Su, et al., "A Digital 1.6 pJ/bit Chip Identification Circuit Using Process Variations", IEEE Journal of Solid-State Circuits, vol. 43, No. 1, Jan. 2008, pp. 69-77.

* cited by examiner

HARDWARE-EMBEDDED KEY BASED ON RANDOM VARIATIONS OF A STRESS-HARDENED INEGRATED CIRCUIT

CROSS REFERENCE TO RELATED APPLICATIONS

This application claims the benefit of U.S. Provisional Patent Application No. 61/801,981, filed Mar. 15, 2013, which is incorporated herein by reference in its entirety.

BACKGROUND

Secure keys are used in a variety of applications, including Platform Root Key, high-bandwidth HDCP key for display protection, EPID key for anonymous attestation of HW device and AACS key for media content protection.

A key may be embedded in an integrated circuit with programmable fuses.

BRIEF DESCRIPTION OF THE DRAWINGS

One or more features are described herein with reference to one or more of the following drawings for illustrative purposes. Methods and systems disclosed herein are not, however, limited to the example illustrations of the drawings.

Figure 1:
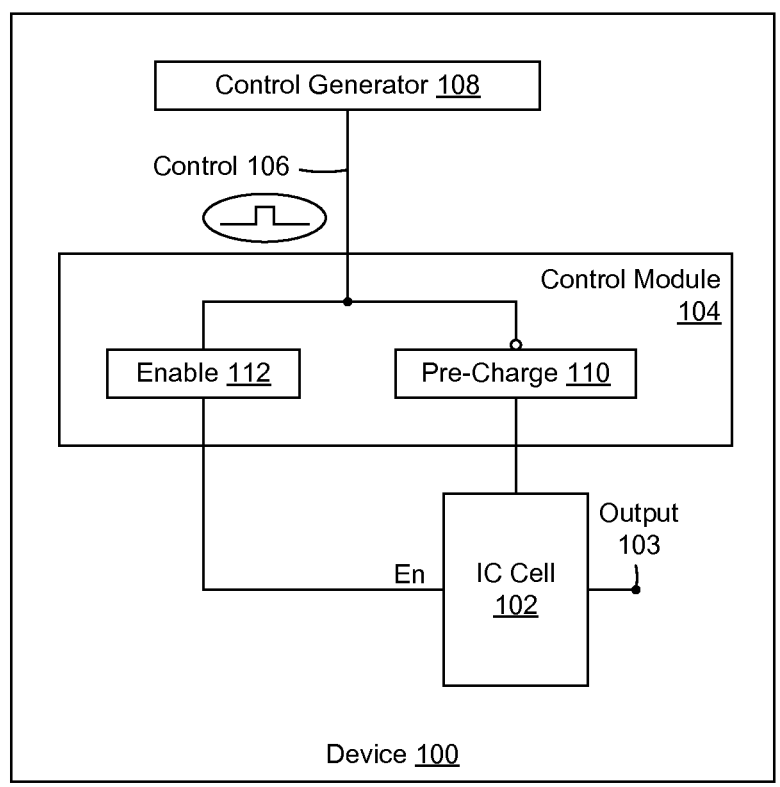
FIG. 1 is a block diagram of an integrated circuit (IC) device including an IC block or cell designed to resolve from an unstable or metastable output state to one of multiple stable output states, each with equal probability, and operated to assert a pre-determined one of the output states based on random variations of the IC cell, such as random process or manufacturing variations.

In the drawings, the leftmost digit(s) of a reference number identifies the drawing in which the reference number first appears.

DETAILED DESCRIPTION

FIG. 1 is a block diagram of an integrated circuit (IC) device 100, including a block of integrated circuitry, illustrated here as an IC cell 102, designed to resolve from an unstable or metastable state to one of multiple stable states with equal probability. A state of IC cell 102 may be determined as a state at an output 103, also referred to herein as an output state.

In practice, IC cell 102 may have a tendency to resolve to a particular one of the stable states, referred to herein as a pre-determined state. The tendency may arise from random inherent features of and/or variations within the IC cell such as, without limitation, random process or manufacturing variations, collectively referred to herein as random variations. The pre-determined state of IC cell 102 may thus be indeterminable prior and/or during manufacture. The tendency of IC cell 102 to resolve to one of the particular states (i.e., the pre-determined state), may be one of degree between a relatively weak tendency and a relatively strong tendency. An IC cell having a relatively strong tendency may be identified as a stable IC cell, such as described further below.

IC device 100 further includes a control module 104 to control IC cell 102. In the example of FIG. 1, control module 104 includes a pre-charge module 110 to pre-charge IC cell 102 to the metastable state. Control module 104 further includes an enable module 112 to enable or release IC cell 102 from the metastable state and resolve to the pre-determined state. A sequence or cycle of pre-charge and enable is referred to herein as an activation of IC cell 102.

IC device 100 may include a control generator 108 to provide a control 106 to control module 104. Alternatively, IC device 100 may be configured to receive control 106 from another device, such as an off-die or off-chip source. Control 106 may include and/or be generated from a clock.

IC device 100 or portions thereof may be implemented of configured as described below with reference to FIG. 2. IC device 100 is not, however, limited to the example of FIG. 2.

Figure 2:
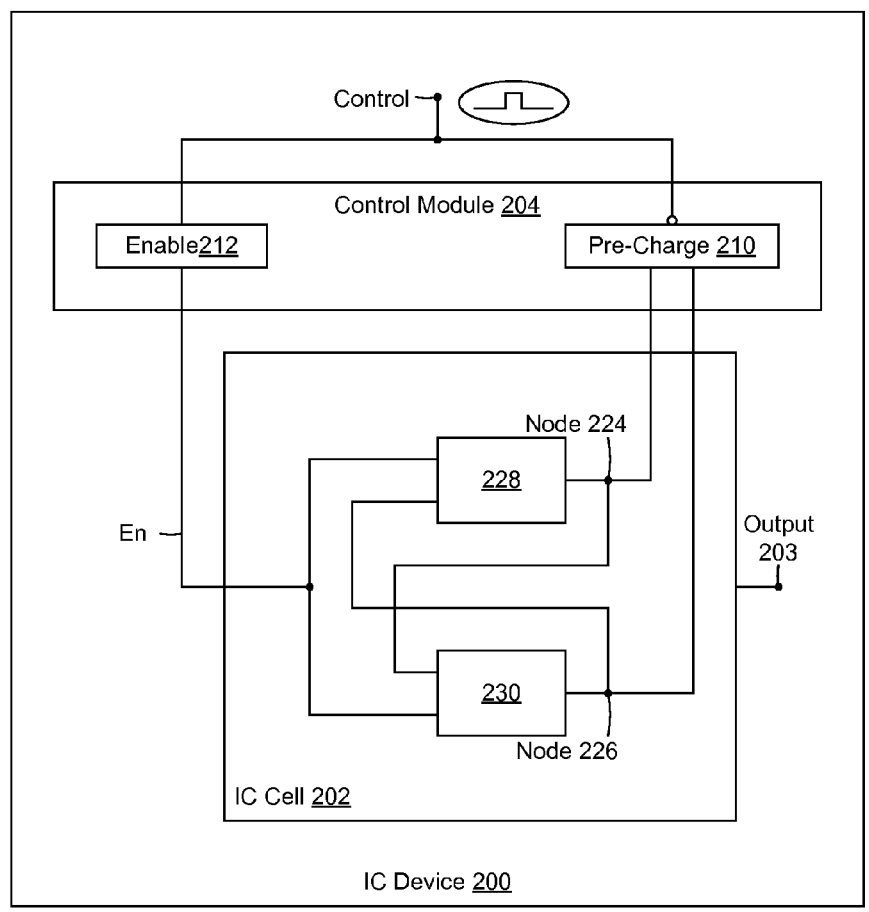
FIG. 2 is a block diagram of another IC device that includes an IC cell and a corresponding control module.

FIG. 2 is a block diagram of an IC device 200, including an IC cell 202 and a control module 204.

IC cell 202 includes circuitry 228 and 230, each to set and/or maintain a state of a corresponding one of nodes 224 and 226. Circuitry 228 and 230 may be configured to maintain nodes 224 and 226 at the same state or at opposite states. Circuitry 228 and/or 230 may be configured to maintain a state of the corresponding node based in part on a state of the other node.

States at nodes 224 and 226 may be represented as one of multiple discrete voltages, which may include a supply voltage Vcc and a voltage reference Vss. Two discrete states, such as Vcc and Vss, may be referred to herein as logic states 1 and 0, respectively, and/or as opposing states, opposite states, and/or complimentary states.

In FIG. 2, control module 204 includes a pre-charge module 210 to pre-charge nodes 224 and 226 to states that are incompatible with one another, corresponding to a metastable state of IC cell 202.

Control module 204 further includes an enable module 212 to enable circuitry 228 and 230 after pre-charge, which may permit or cause circuitry 228 and 230 to contend with one another to resolve the state of one of nodes 224 and 226 to a state that is compatible with the pre-charge state of the other node. The resultant state of IC cell 202 is referred to herein as the pre-determined state of IC cell 202. The pre-determined state of IC cell 202 may depend upon relative strengths of circuitry 228 and 230.

Circuitry 228 and 230 may be designed to have identical strengths such that, under ideal manufacturing conditions, there is equal probability that the pre-determined state of IC cell 202 is governed or determined by circuitry 228 or circuitry 230. Random variations within IC device 200 (e.g., variations within IC cell 202, enable module 212, and/or pre-charge module 210) may, however, result in an inherent difference in relative strengths of circuitry 228 and 230. Because of the difference in relative strengths, there may be a greater probability that the pre-determined state of IC cell 202 is governed by circuitry 228 or circuitry 230. The probability may depend upon an extent of the inherent difference in relative strengths of circuitry 228 and 230.

Where the inherent difference in relative strengths of circuitry 228 and 230 is relatively large, IC cell 202 may be sufficiently stable so as to reliably resolve to the pre-determined state with aging and substantially impervious to instantaneous thermal noise and variations in temperature and operating voltage. A group of such stable IC cells may be may be configured as a hardware-embedded key having an inherent uniqueness based on random variations of each of the IC cells, such as described below with reference to FIG. 9.

IC cell 202 may be stress-hardened to increase or magnify the inherent difference between circuitry 228 and 230, and thus improve and/or increase stability of IC cell 202. Where IC cell 202 is initially relatively unstable due to a relatively low inherent difference between circuitry 228 and 230, stress-hardening may increase the difference to render IC cell 202 sufficient stable. Where IC cell 202 is initially relatively stable, stress-hardening may further increase the stability of IC cell 202.

Circuitry 228 and/or circuitry 230 may include a device to pull-down a corresponding one of nodes 224 and 226 to Vss when enabled, and/or a device to pull-up the corresponding node to Vcc when enabled, examples of which are provided below. Methods and systems disclosed herein are not, however, limited to pull-up or pull-down devices.

IC device 200 may be implemented or configured as described in one or more examples below. IC device 200 is not, however, limited to the examples below.

Figure 3:
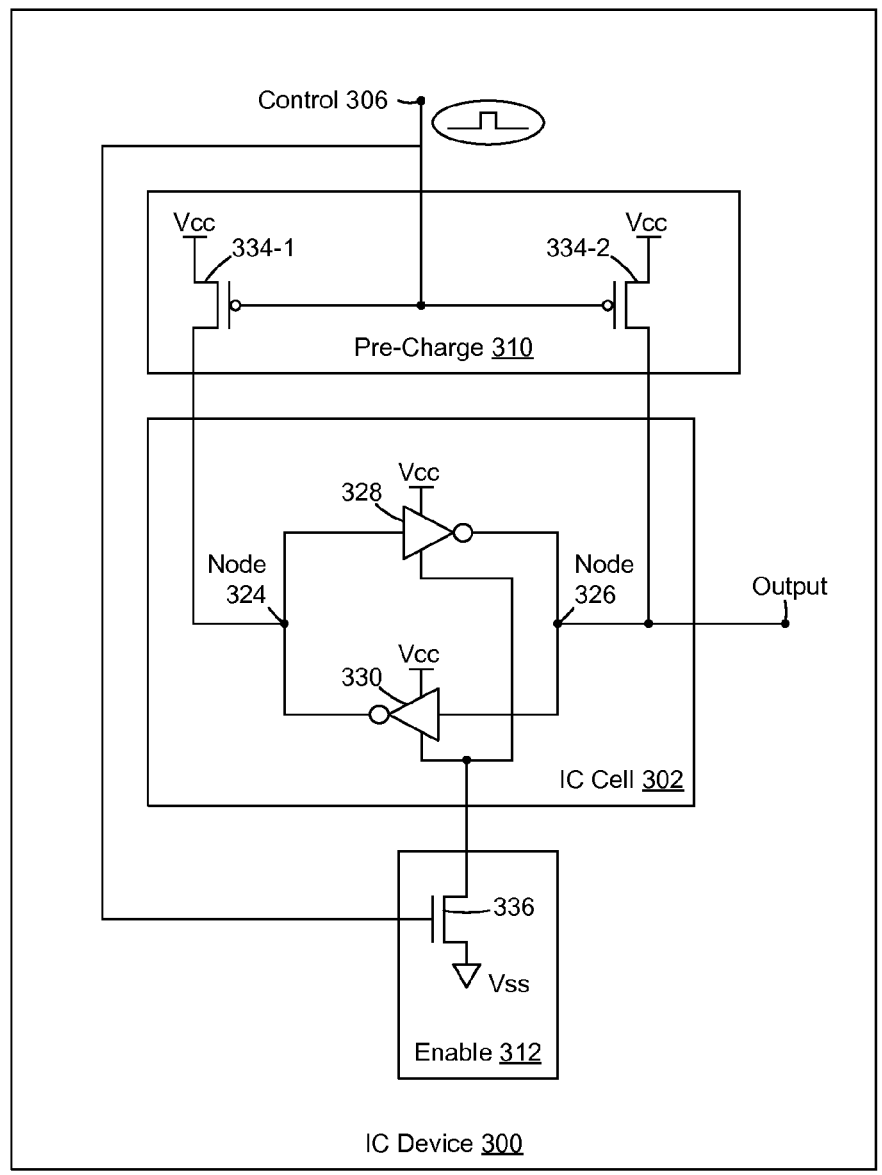
FIG. 3 is a logic diagram of another IC device an IC cell having cross-coupled inverters.

FIG. 3 is a logic diagram of an IC device 300, including an IC cell 302 having inverters 328 and 330, each having an output coupled to an input of the other to maintain opposite states at nodes 324 and 326. Inverters 328 and 330 are referred to herein as cross-coupled inverters.

Node 324 and/or node 326 may serve as an output of IC cell 302. In FIG. 3, node 326 is shown as an output of IC cell 202 for illustrative purposes.

IC device 300 further includes a pre-charge module 310 to pre-charge nodes 324 and 326 when a control 306 is at a first state, also referred to herein as an inactive state. In the example of FIG. 3, pre-charge module 310 includes p-channel devices 334-1 and 334-2 to pull-up corresponding nodes 324 and 326 to Vcc. Pre-charge module 310 is not, however, limited to pull-ups or p-channel devices. Additional examples are provided further below.

IC device 300 further includes an enable module 312 to enable inverters 328 and 330 when control 306 is at a second state, also referred to herein as a pre-determined state. In the example of FIG. 3, enable module 312 includes an n-channel device 336 to provide Vss to inverters 328 and 330. Enable module 312 may include multiple n-channel devices. Enable module 312 is not, however, limited to pull-downs or n-channel devices. Additional examples are provided further below.

IC cell 302 is configured to be pre-charged to a metastable state in which nodes 324 and 326 are pulled-up to Vcc, and to be released to resolve from the metastable state to one of two output states (i.e., Vcc at node 324 and Vss at node 326, or Vss at node 324 and Vcc at node 326), depending on relative strengths of inverters 328 and 330.

IC device 300 may be implemented or configured as described below with reference to FIG. 5. IC device 300 is not, however, limited to the example of FIG. 5.

Figure 4:
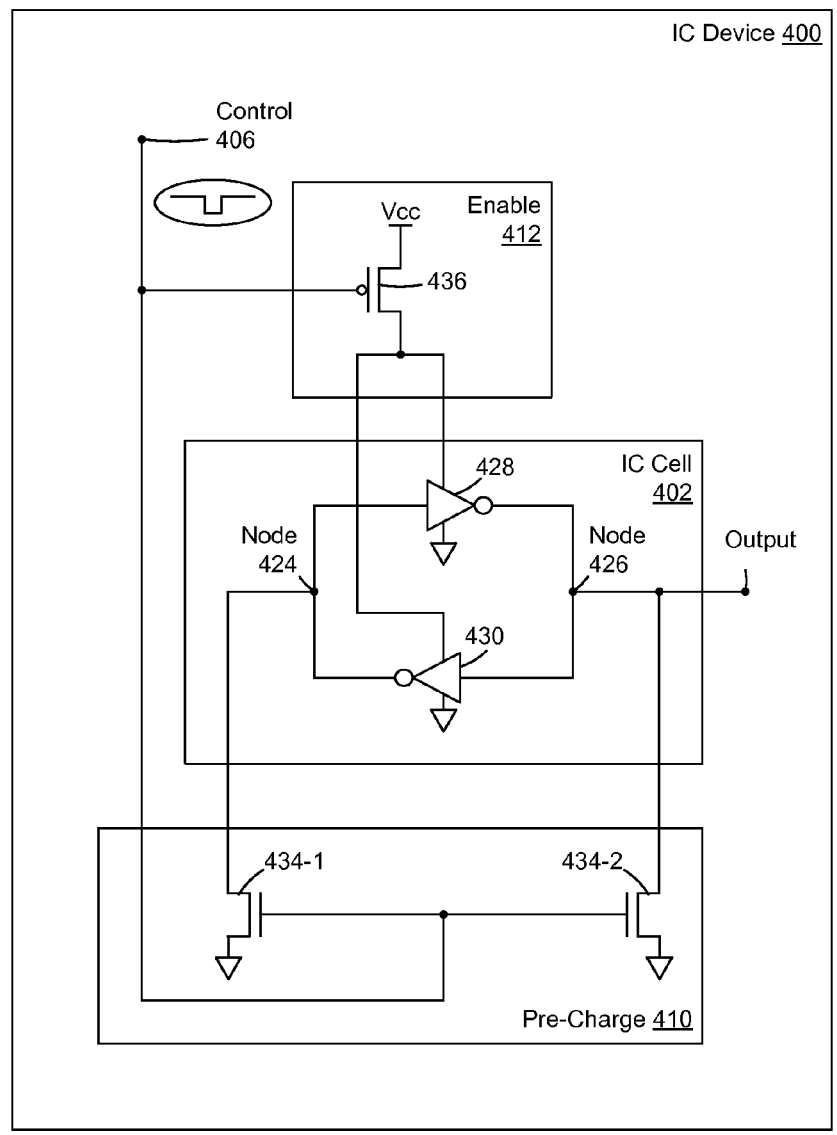
FIG. 4 is a logic diagram of another IC device that includes an IC cell having cross-coupled inverters.

FIG. 4 is a logic diagram of an IC device 400, including an IC cell 402 having cross-coupled inverters 428 and 430 to assert opposite states at nodes 424 and 426.

IC device 400 includes a pre-charge module 410 to pre-charge IC cell 402 when a control 406 is inactive. In the example of FIG. 4, pre-charge module 410 includes n-channel devices 434-1 and 434-2 to pull-down corresponding nodes 424 and 426 to Vss.

IC device 400 further includes an enable module 412 to enable inverters 428 and 430 when control 406 is active. In the example of FIG. 4, enable module 412 includes a p-channel device 436 to provide Vcc to inverters 428 and 430.

IC cell 402 is configured to be pre-charged to a metastable state in which nodes 324 and 326 are pulled-down to Vss, and to be released to resolve from the metastable state to one of two output states (i.e., Vcc at node 424 and Vss at node 426, or Vss at node 424 and Vcc at node 426), depending on relative strengths of inverters 428 and 430.

Figure 5:
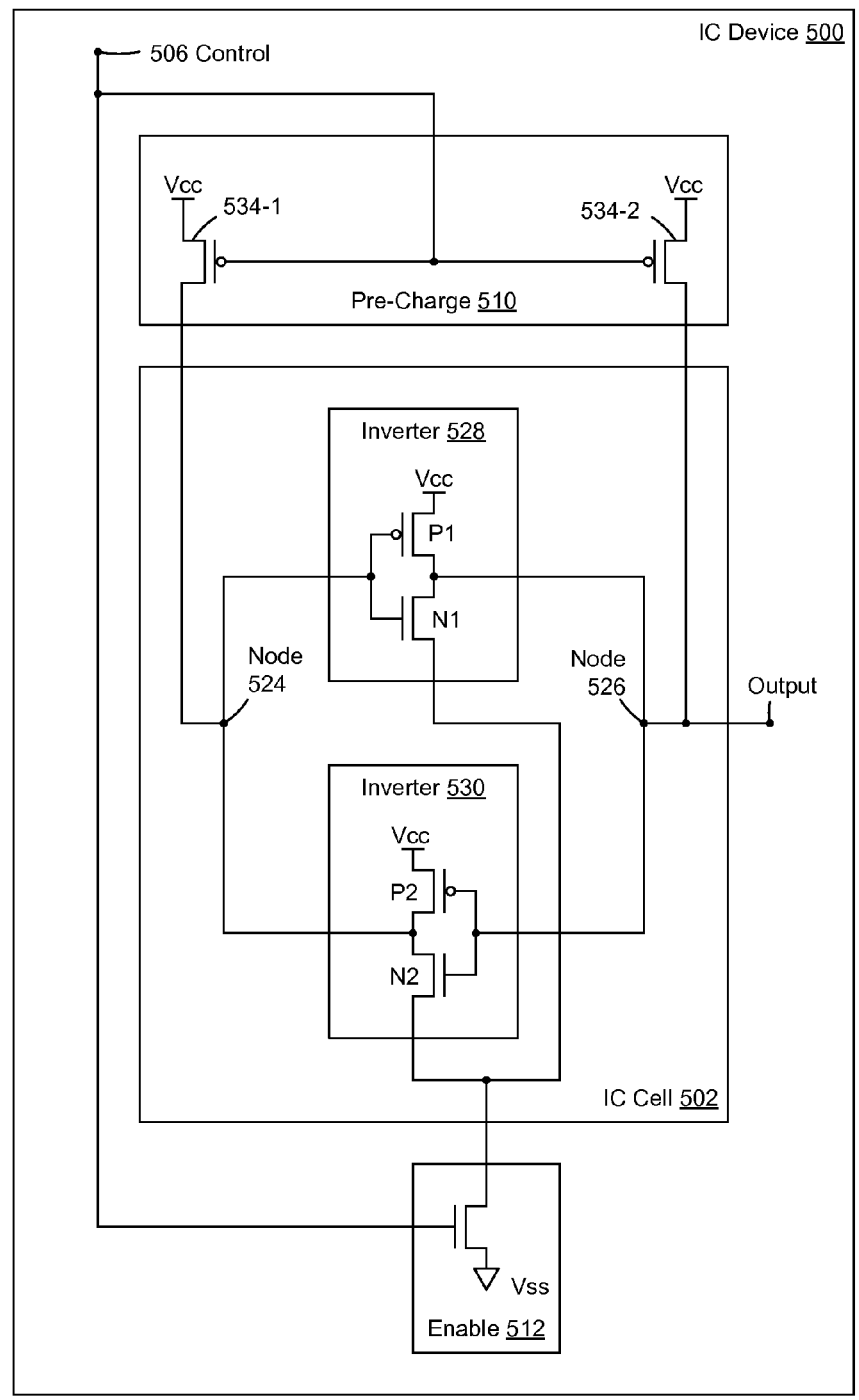
FIG. 5 is a circuit diagram of another IC device that includes an IC cell having cross-coupled inverters.

FIG. 5 is a circuit diagram of an IC device 500, including an IC cell 502, having cross-coupled inverters 528 and 530 to assert opposite states at nodes 524 and 526.

Inverter 528 includes a p-channel device P1 to pull-up node 526 to Vcc when node 524 is pulled-down to Vss. Inverter 528 further includes an n-channel device N1 to pull-down node 526 to Vss when node 524 is pulled-up to Vcc. Similarly, inverter 530 includes a p-channel device P2 to pull-up node 524 to Vcc when node 526 is pulled-down to Vss. Inverter 530 further includes an n-channel device N2 to pull-down node 524 to Vss when node 526 is pulled-up to Vcc. Methods and systems disclosed herein are not, however, limited to the example configurations of FIG. 5.

IC device 500 further includes a pre-charge module 510 to pre-charge nodes 524 and 526 to metastable states when a control 506 is inactive. In the example of FIG. 5, pre-charge module 510 is configured to pull-up nodes 524 and 526 to Vcc, such as described above with respect to FIG. 3. In another example embodiment, pre-charge module 510 is configured to pull-down nodes 524 and 526 to Vss, such as described above with respect to FIG. 4.

IC device 500 further includes an enable module 512 to provide Vss to inverters 528 and 530 when control 506 is active. In another example embodiment, enable module 512 is configured to provide Vcc to nodes 524 and 526, such as described above with respect to FIG. 4.

In FIG. 5, inverters 528 and 528 are configured such that, upon release from the metastable state (i.e., upon activation of a control 506), devices N1 and N2 vie or contend to pull-down respective nodes 526 and 524 to Vss.

If device N1 is stronger than device N2, node 526 is pulled-down to Vss through device N1, which turns-on device P2 to pull-up node 524 to Vcc. In this example, the pre-determined state of IC cell 500 is governed by device N1, and may be represented as logic states {0,1} at nodes 526 and 524, respectively. Where node 526 corresponds to an output of IC cell 502, the pre-determined output state of IC cell 502 in this example is Vss or logic 0.

Conversely, where device N2 is stronger than device N1, node 524 is pulled-down to Vss through device N2, which turns-on device P1 to pull-up node 526 to Vcc. In this example, the pre-determined state of IC cell 500 is governed by device N2, and may be represented as logic states {1,0} at nodes 526 and 524, respectively. Where node 526 corresponds to the output of IC cell 502, the pre-determined output state of IC cell 502 in this example is Vcc or logic 1.

Figure 6:
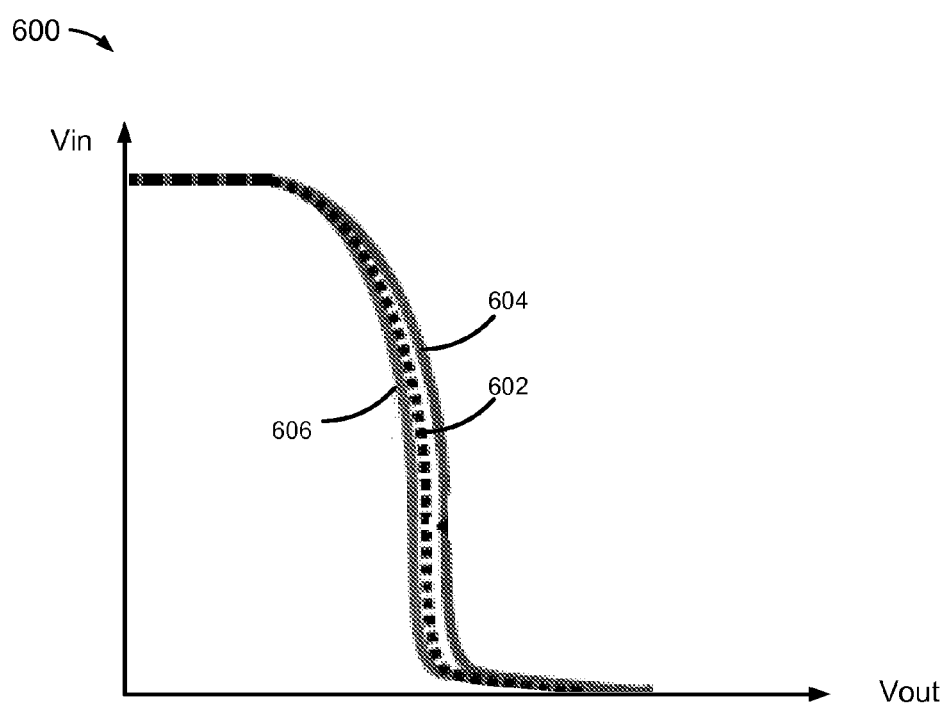
FIG. 6 is a graph of example voltage transfer curves (VTCs), including a design-based VTC, and VTCs for devices manufactured in accordance with the design.

FIG. 6 is a graph 600 of example voltage transfer curves (VTCs) 602, 604, and 606. VTC 602 (hashed-line) represents a design-based VTC, which may correspond to ideal manufacturing conditions. VTC 604 is for a hypothetical first circuit manufactured in accordance with the design. VTC 606 is for a hypothetical second circuit manufactured in accordance with the design.

For illustrative purposes, VTC 604 is described below as corresponding to inverter 528 in FIG. 5, and VTC 606 is described below as corresponding to inverter 530 in FIG. 5.

Under ideal manufacturing conditions, VTCs 604 and 606 would match VTC 602. Due to random variations, however, there is relative separation between VTCs 604 and 606, indicating mismatch between inverters 528 and 530 in FIG. 5. In this example, inverter 530 is stronger than inverter 528. Thus, when nodes 524 and 526 are activated (i.e., pre-charged to Vcc and released), device N2 of inverter 530 pulls-down node 524 to Vss with sufficient strength to cause device P1 of inverter 528 to pull-up node 526 to Vcc. In this situation, IC cell 502 resolves from the metastable state to a pre-determined output state of Vcc or logic 1 at node 526.

Where the relative distance between VTCs 604 and 606 is relatively large, IC cell 502 may be sufficiently stable. Where the relative distance between curves 604 and 606 is relatively small, IC cell 502 may be somewhat unstable or unreliable in that the pre-determined state may be affected by instantaneous thermal noise, temperature variations, and/or voltage variations.

An IC cell may be stress-hardened to magnify a relative difference between VTCs and thus increase the stability and/or reliability of the IC cell. Stress-hardening may include subjecting an IC cell or a portion thereof to a stress condition to weaken one device relative to another.

Stress-hardening may include voltage stress, temperature stress, and/or other environmental stress. Stress-hardening may be designed or configured to accelerate age-related characteristics or conditions of an IC cell or portions thereof. Stress-hardening may be performed in conjunction with and/or as part of a burn-in procedure.

Stress-hardening may be designed or configured to weaken a device that is turned-on. In this example, the IC cell may be configured to turn-on a weaker one of two devices when subjected to a stress condition. A weaker device may be determined indirectly from the pre-determined output state of the IC cell. In FIG. 5, for example, a pre-determined output state of Vss (logic 0) at node 526 indicates that device N2 is weaker than device N1. Conversely, a pre-determined output state of Vcc (logic 1) at node 526 indicates that device N1 is weaker than device N2.

Stress-hardening configuration parameters may be selected based on the pre-determined output state of an IC cell. In the example of FIG. 5, if the pre-determined output state is Vss (logic 0), IC cell 502 may be configured to assert Vcc (logic 1) at node 526 for stress-hardening. Configuring of IC cell 502 may include activating enable module 512 and controlling pre-charge device 534-2 to pull-up node 526 until device N2 turns-on to pull-down node 524 to Vss, and thereby turning-off device N1. Conversely, if the pre-determined output state is Vcc (logic 1) in FIG. 5, IC cell 502 may be configured to assert Vss (logic 0) at node 526 for stress-hardening.

Methods and systems are described below to determine a measure of stability for an IC cell based output states of the IC. The measure of stability may reflect an extent of an inherent proclivity of the IC cell to resolve from an unstable output state to a pre-determined output state.

Figure 7:
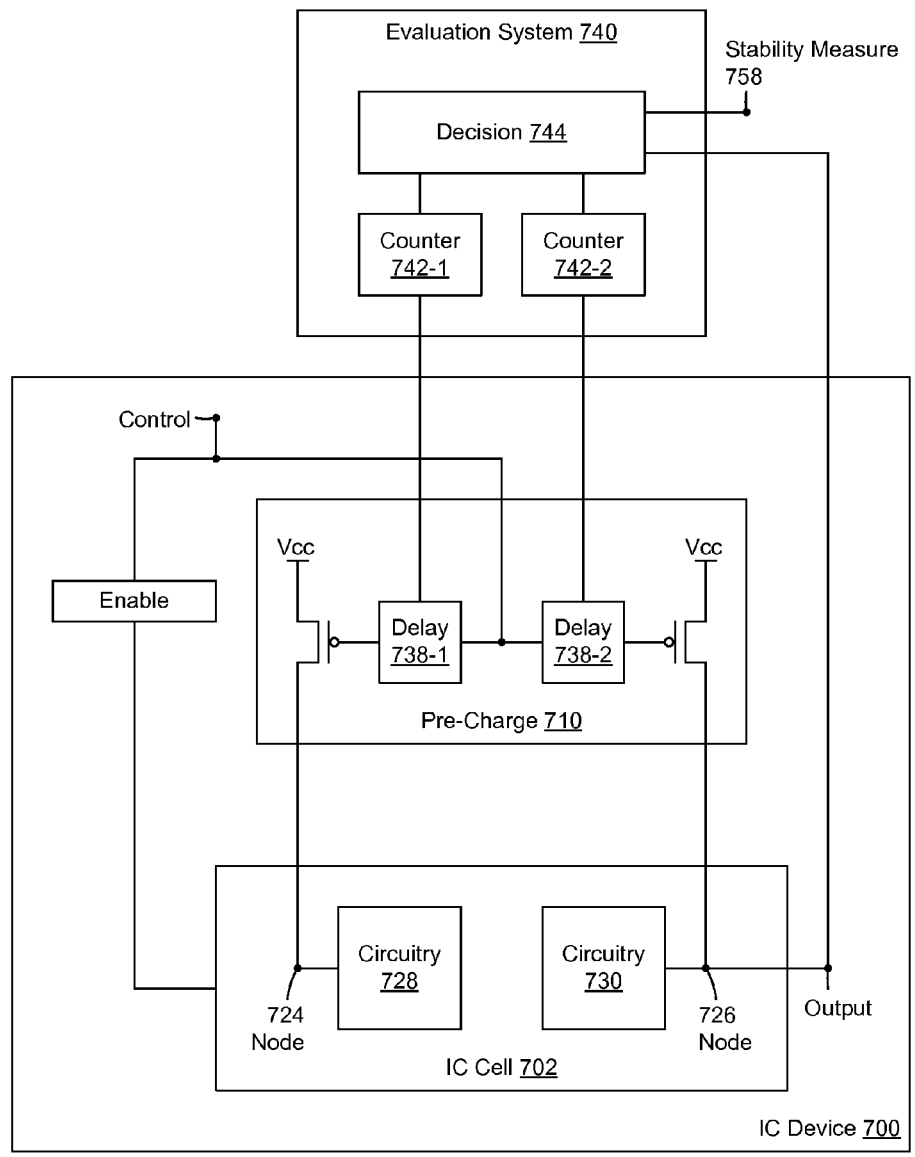
FIG. 7 is a block diagram of an evaluation system to determine an indirect measure of relative separation between VTCs of circuitry within an IC cell based on output states of the IC cell, and to determine a measure of stability for the IC cell based on the indirect measure.

FIG. 7 is a block diagram of an evaluation system 740 to determine an indirect measure of relative separation between VTCs of circuitry within an IC cell based on output states of the IC cell, and to determine a measure of stability for the IC cell based on the indirect measure.

Evaluation system 740 is described below with reference to an IC device 700 that includes an IC cell 702. In the example of FIG. 7, IC cell 702 includes first and second circuitry 728 and 730 to control and/or maintain states of corresponding nodes 724 and 726. Circuitry 728 and 730 may be configured as described in one or more examples herein.

IC device 700 further includes a pre-charge module 710 to pre-charge nodes 724 and 726 to metastable states when control 706 is inactive. Pre-charge module 710 includes first and second pre-charge devices, 734-1 and 734-2, each to pre-charge a corresponding one of nodes 724 and 726. Pre-charge module 710 further includes variable or controllable delay elements 738-1 and 738-2, each to delay de-activation of a corresponding one of pre-charge devices 734-1 and 734-2.

In FIG. 7, evaluation system 740 includes one or more counters, illustrated here as counters 742-1 and 742-2, to control corresponding delay elements 738-1 and 738-2. Evaluation system 740 further includes a decision module 744 to selectively increment counter 742-1 and/or counter 742-2 based on a pre-determined output state at node 726. Where evaluation system 740 includes a single counter, decision module 744 may be configured to selectively control delay element 738-1 or delay element 738-2 with the single counter based on the pre-determined output state at node 726.

Decision module 744 is described below with reference to an example in which, if circuitry 728 is stronger than circuitry 730, IC cell 702 resolves to a pre-determined output state of logic 1 and, if circuitry 730 is stronger than circuitry 728, IC cell 702 resolves to a pre-determined output state of logic 0.

Evaluation system 740 may be configured to determine the pre-determined output state at node 726 when counters 742 are initialized or configured to provide no delay. Evaluation system 740 may be further configured to thereafter increment one of counters 742 based on the pre-determined output state.

For a pre-determined output state at node 726 of logic 1, evaluation system 740 is configured to increment counter 742-2 prior to a subsequent activation of IC cell 702. As a result, during the subsequent activation of IC cell 702, release of circuitry 730 from the metastable state will be delayed relative to the release of circuitry 728 from the metastable state. The delay effectively reduces the relative separation between the VTCs of circuitry 728 and 730. Correspondingly, the delay reduces the strength of circuitry 730 relative to that of circuitry 728. Conversely, if the initial output logic state is 0, counter 742-1 may be incremented.

Evaluation system may be configured to repeatedly increment the count and activate IC cell 702 until the output state at node 726 changes to logic 0. When the output state changes to logic 0, the corresponding count (and delay) provides an indirect measure of relative separation of the VTCs of circuitry 728 and 730.

Decision system 744 may be configured to output a measure of stability 758 based at least in part on the count. Evaluation system 740 may be configured to evaluate IC cell 702 over a range of one or more environmental conditions (e.g., variations in temperature and/or voltage), and to determine stability measure 785 based on a combination of corresponding counts.

Figure 8:
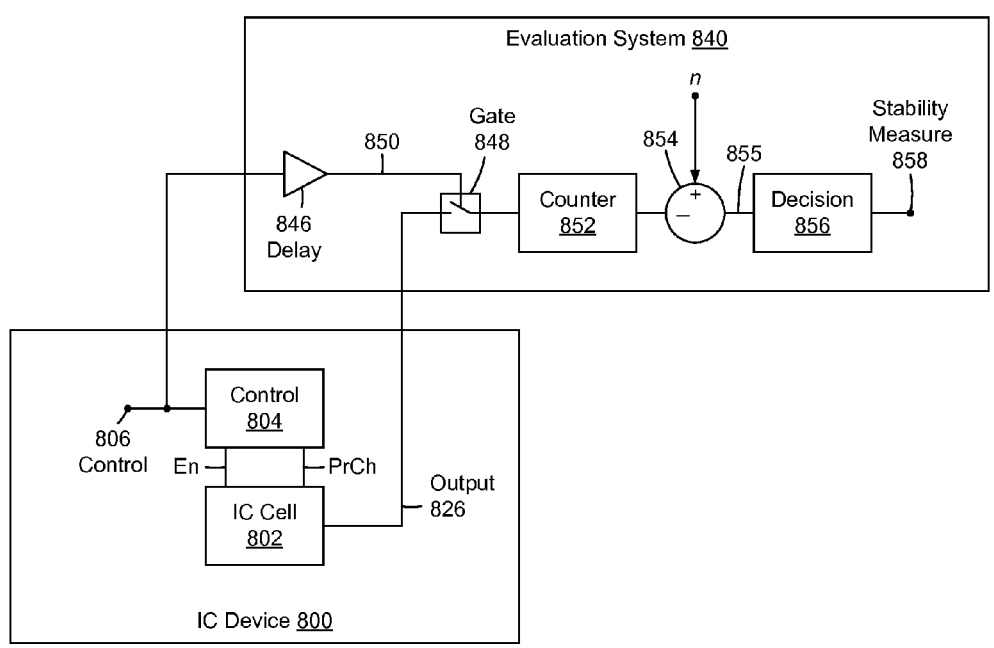
FIG. 8 is a block diagram of an evaluation system to determine a measure of stability for an IC cell based on output states of the IC cell over multiple activations.

FIG. 8 is a block diagram of an evaluation system 840 to determine a measure of stability for an IC cell based on output states of the IC cell over multiple activations.

Evaluation system 840 is described below with reference to an IC cell 802 of an IC device 800. IC device 800 and/or IC cell 802 may be configured as described in one or more examples herein. In FIG. 8, IC device 800 includes a control module 804 to activate IC cell 802 (e.g., pre-charge and enable/release) based on a control 806, such as described in one or more examples herein.

Evaluation system 840 includes a gate device 848 to gate an output 826 of IC cell 802 based on control 806. Evaluation system 840 may further include a delay element 846 to delay activation of gate device 848 to coincide with post-activation output states of IC cell 802.

Evaluation system 840 further includes a counter 852 to increment a count when the output state of IC cell 802 is at a first state, such as Vcc, or logic 1. In this example, after n activations of IC cell 802, if the output state of IC cell 802 is Vcc for each of the n activations, the count will equal n. Conversely, if the output state is Vss for each of the n activations, the count will equal 0 after the n activations. If the output state varies (i.e., is unstable) over the n activations, the count will be between 0 and n. (i.e., greater than 1 and less than n). Alternatively, counter 852 may be configured to increment the count when the output state of IC cell 802 is at a second state, such as Vss, or logic 0.

Evaluation system 840 further includes a comparator 854, illustrated here as a summing device, to compare the count to n after n activations of IC cell 802. Comparator 854 may be configured to output a difference between the count and n as a comparison result 855.

Evaluation system 840 further includes a decision module 856 to determine a measure of stability 858 of IC cell 802 based on comparison result 855. Decision module may be configured determine measure 858 as one of stable or unstable, and/or a scale. For example, if comparison result 855 equals 0 or n, decision module 856 may output stability measure 858 to indicate that IC cell 802 is stable. Conversely, if comparison result 858 is between 0 and n (i.e., greater than 0 and less than n), decision module 856 may output stability measure 858 to indicate that IC cell 802 is not stable, relatively unstable, and/or insufficiently stable. If decision module 856 is configured to output stability measure 858 on a scale, stability measure 858 may be highest where comparison result 855 equals 0 or n, and may be lowest where comparison result 855 equals n/2.

An evaluation system may include a combination of one or more features described above with respect to FIGS. 7 and 8.

An IC device may include multiple IC cells, and may be configurable to generate a word based on pre-determined output states of selectable ones of the IC cells, such as described below with reference to FIG. 9.

Figure 9:
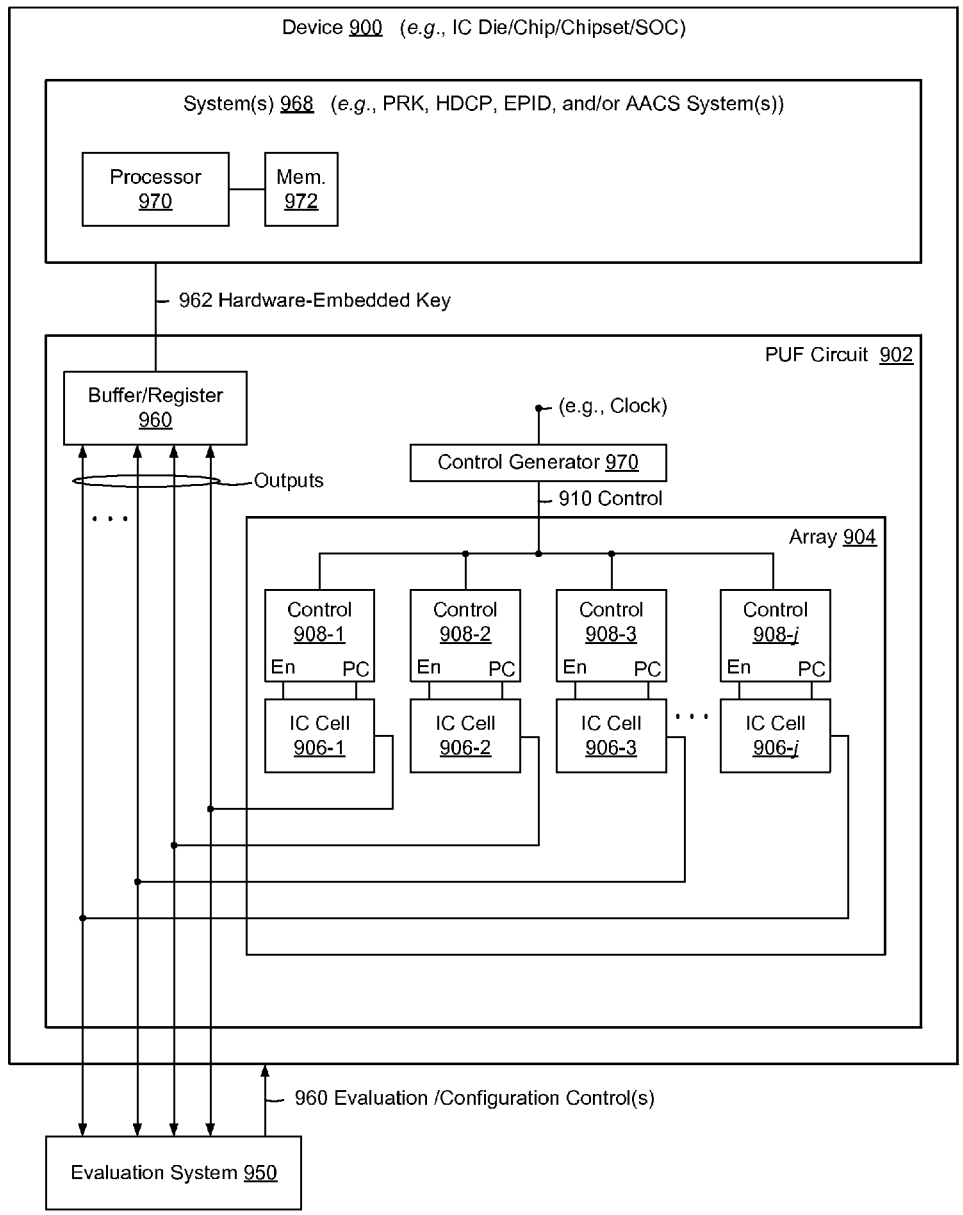
FIG. 9 is a block diagram of a device that includes integrated circuitry referred to herein as a physically unclonable function (PUF) circuit to generate a key based on random variations of the PUF circuit, such that the key is unique to the IC device.

FIG. 9 is a block diagram of a device 900, including integrated circuitry 902, also referred to herein as a physically unclonable function (PUF) circuit 902, to generate a word or key based on random variations within PUF circuit 902, such that the word is unique to IC device 900. Device 900 may represent, without limitation, an IC die, chip, chipset, or system-on-a-chip (SOC).

PUF circuit 902 includes an array 904 of IC cells 906, one or more of which may be configured as described in one or more examples herein.

PUF circuit 902 further includes control modules 908 to control IC cells 906 based on a control 910. Control modules 908 may be configured to activate IC cells 906 (i.e., to precharge IC cells 906 to metastable states, and to release IC cells 906 from the metastable states), such as described in one or more examples herein. Control modules 908 may be configured to activate IC cells 906 upon power-up.

In the example of FIG. 9, a control module 908 is provided for each IC cell 906. In another example embodiment, a control module 908, or portions thereof, may be shared amongst multiple IC cells 906.

PUF circuit 902 or device 900 may include a control generator 970 to provide control 910. Alternatively, control 910 may be received from an off-chip or off-die source.

PUF circuit 902 may be configurable to generate a word 962 based on pre-determined output states of selectable ones of IC cells 906.

An evaluation system 950 may be configured to determine measures of stability for IC cells 906, select a subset of IC cells 906 based on the measures of stability, and configure PUF 902 to generate word 962 based on the selected IC cells, such as described in one or more examples herein.

Device 900 may include a module 960 to receive pre-determined output states of IC cells 906, and to present the pre-determined output states of the selected IC cells as word 962. Module 960 may include, without limitation, a driver, a buffer, and/or a register.

Device 900 may further include one or more systems, devices, and/or circuitry to receive and/or utilize word 962, illustrated here as including a processor 970 and corresponding memory 972.

Figure 10:
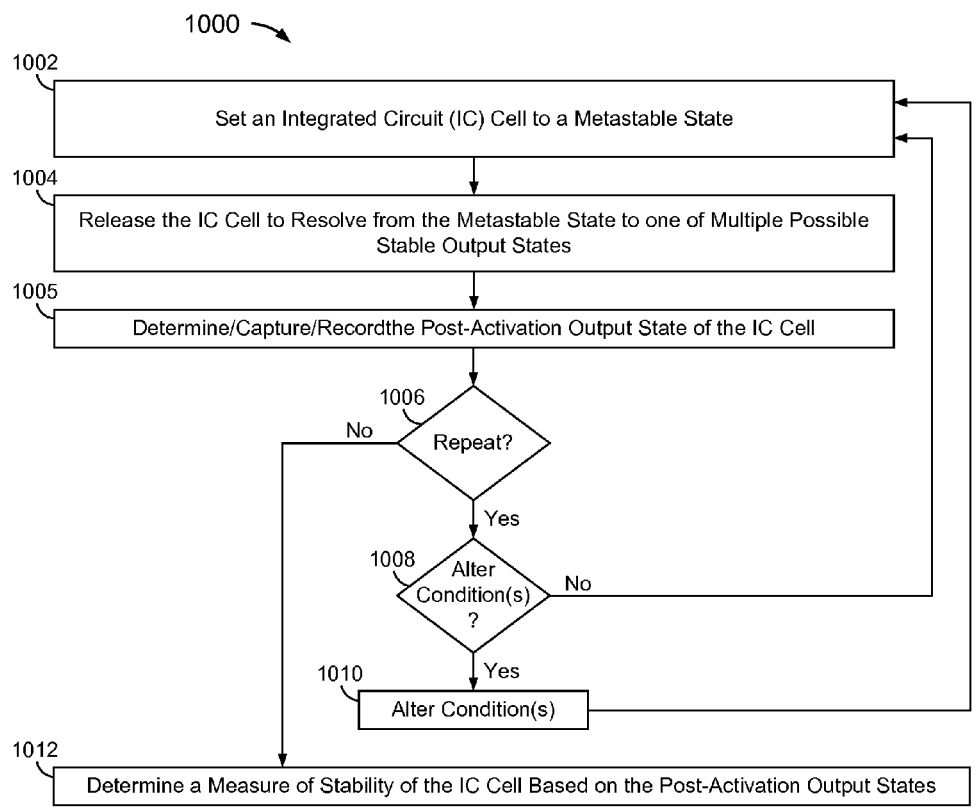
FIG. 10 is a flowchart of a method of determining a measure of stability for an IC cell based on output states of the IC cell.

FIG. 10 is a flowchart of a method 1000 of determining a measure of stability for an IC cell based on post-activation output states of the IC cell.

At 1002, the IC cell is set to a metastable state. This may include pre-charging one or more nodes of the IC cell to states that incompatible with one another, such as described in one or more examples herein.

At 1004, the IC cell is released from the metastable state to permit the IC cell to resolve to one of multiple possible output states. The releasing at 1004 may include discontinuing the pre-charging and enabling the IC cell, such as described in one or more examples herein.

The setting of the IC cell to the metastable state at 1002, and the releasing the IC cell from the metastable state at 1004, may be referred to collectively as activating the IC cell.

At 1005, the corresponding post-activation output state of the IC cell is determined.

At 1006, the activating of the IC cell at 1002 and 1004 may be repeated to obtain additional post-activation output states with which to evaluate the IC cell.

At 1008 and 1010, one or more conditions of the IC cell may be altered over the course of multiple activations of the IC cell, such as to obtain post-activation output states over a range of the condition(s). Altering at 1010 may include altering an operating voltage and/or temperature of the IC cell, and/or delaying the release of one node from the metastable state relative to the other node, such as described above with reference to FIG. 7.

At 1012, a measure of stability is determined for the IC cell based on the post-activation output states determined at 1005. The measure of stability may represent a measure of confidence that a pre-determined one of the multiple output state will remain the same with age, instantaneous (thermal noise), and/or variations in temperature and/or voltage.

The determining at 1012 may include determining an indirect relative measure of separation of voltage transfer curves, such as described above with reference to FIG. 7.

The determining at 1012 may include selectively incrementing a count based on the output state, over n activations of the IC cell (i.e., n repetitions of 1002 and 1004), and determining the measure of stability based on a difference between the count and n, such as described above with respect to FIG. 8.

The determining at 1012 may include determining the measure of stability based on multiple techniques and/or criteria, such as a combination of one or more features described above with respect to each of FIGS. 7 and 8. The determining at 1012 is not, however, limited to the examples of FIG. 7 or FIG. 8.

Figure 11:
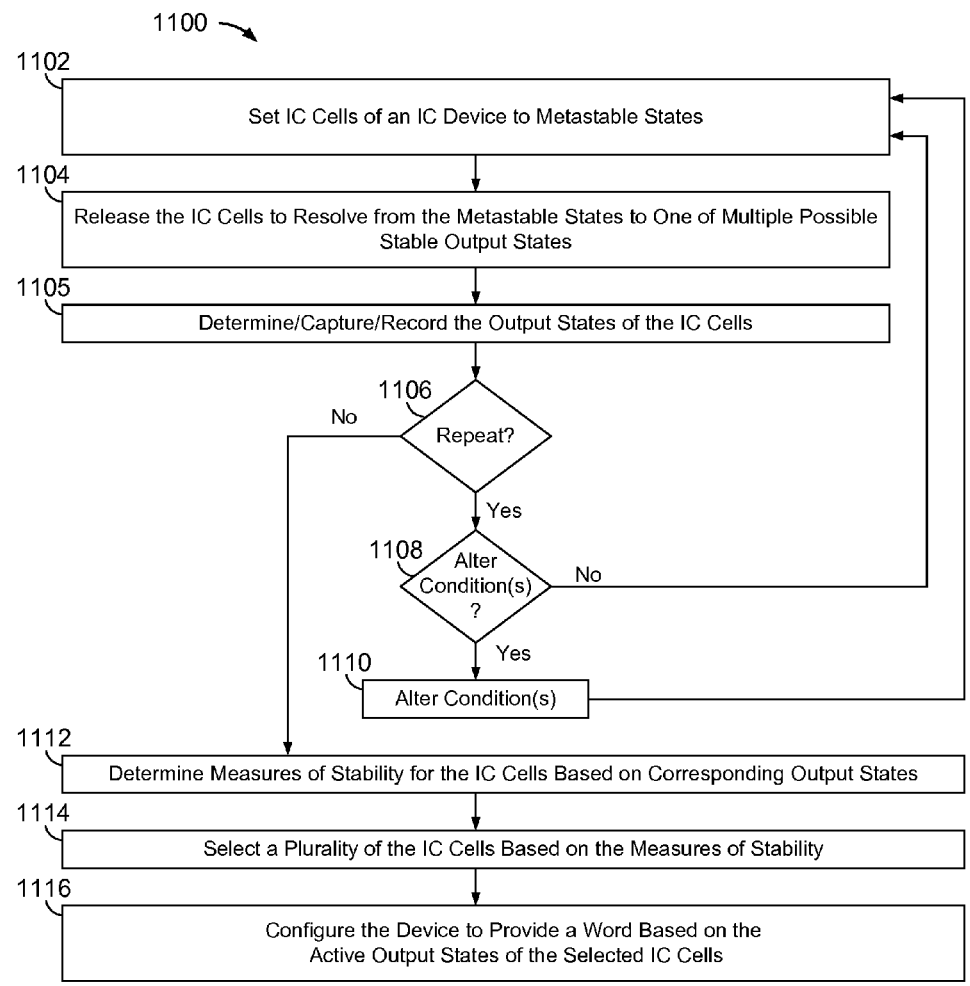
FIG. 11 is a flowchart of a method of determining measures of stability for multiple IC cells of an IC device based on corresponding output states, and configuring a selected subset of the IC cells as a hardware-embedded key.

FIG. 11 is a flowchart of a method 1100 of determining measures of stability for multiple IC cells of an IC device, and selecting a subset of the IC cells to generate a unique key.

At 1102, the IC cells are set to a metastable state, such as described above with respect to 1002 in FIG. 10.

At 1104, the IC cells are released from the metastable states to permit each of the IC cells to resolve to one of multiple output states, such as described above with respect to 1004 in FIG. 10.

At 1105, corresponding post-activation output states of the IC cells are determined.

At 1106, the activating of the IC cell at 1102 and 1104 may be repeated to obtain additional post-activation output states with which to evaluate the IC cells, such as described above with respect to 1006 in FIG. 10.

At 1108 and 1110, one or more conditions of the IC cells may be altered over multiple activations of the IC cell, such as described above with respect to 1008 and 1010 in FIG. 10.

At 1112, measures of stability are determined for the IC cells based on the corresponding output state(s), such as described above with respect to 1012 in FIG. 10.

At 1114, a subset of the IC cells is selected based at least in part on the measures of stability, such as described in one or more examples herein.

At 1116, the IC device is configured to activate at least the selected IC cells upon-power up, to generate a unique word or key based on pre-determined output states of the selected IC cells, such as described above with respect to FIG. 9.

Method 1000 and/or method 1100 may further include stress-hardening an IC cell to reinforce or strengthen an existing bias or tendency to resolve to the pre-determined output state. Stress-hardening may be performed or configured to alter VTC of one or more devices of the IC cell, such as to increase a difference in relative strengths of first and second devices. Stress-hardening may be configured, for example, to further weaken a weaker one of the first and second devices. Stress-hardening may be performed or configured to increase a tolerance of the IC cell to changes and/or variations in one or more environmental conditions and/or instantaneous thermal noise.

Figure 12:
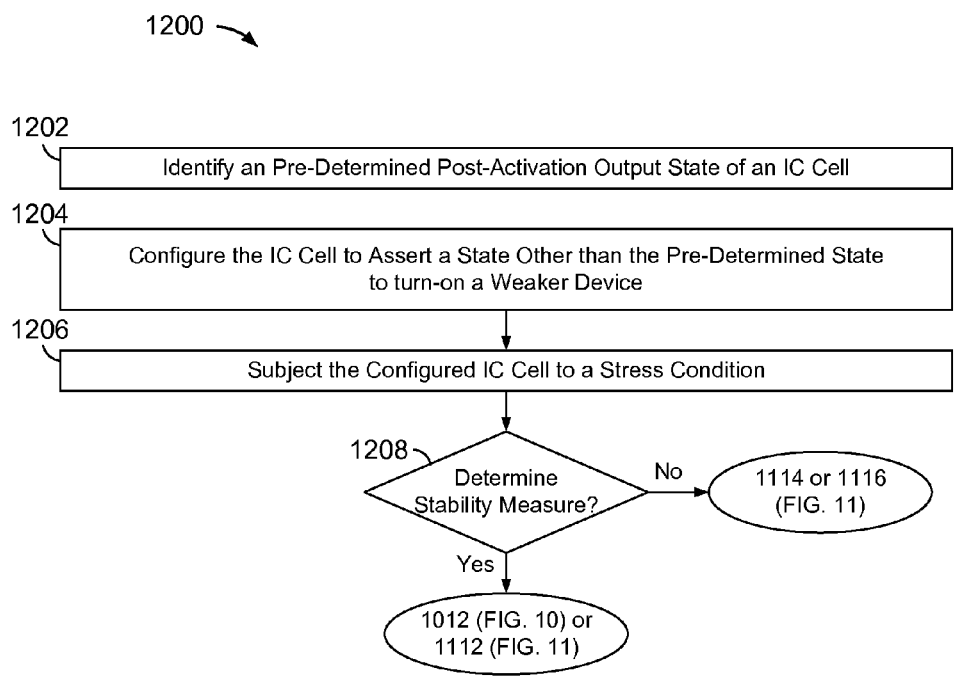
FIG. 12 is a flowchart of a method of stress-hardening one or more IC cells of an IC device based on output states of the IC cell(s).

FIG. 12 is a flowchart of a method 1200 of stress-hardening one or more IC cells of an IC device. Method 1200 may be performed after determining a pre-determined state of an IC cell, and may be performed before and/or after determining a measure of stability with respect to the pre-determined state. Method 1200 may be performed prior to and/or after selecting IC cells at 1114 in FIG. 11. Method 1200 may be performed prior to and/or after configuring the IC device to generate a key from selected IC cell at 1116 FIG. 11. Method 1200 may be performed with respect to all IC cells of the IC device or a subset thereof.

At 1202, a pre-determined output state of an IC cell is determined, such as described in one or more examples herein.

At 1204, the IC cell is configured based on the pre-determined output state. Configuration parameters may be selected to cause the IC cell to assert an output state other than the pre-determined output state of the IC cell, such as to turn-on a weaker device as described further above with reference to FIG. 6.

At 1206, the IC cell is subjected to one or more stress conditions while configured as described above at 1202, to stress the turned-on device. The stressing at 1206 may include increasing an operating voltage applied to the IC cell or a portion thereof, increasing a temperature of the IC cell, and/or other condition(s), such as to simulate aging of the turned-on device. The IC cell may be subjected to the stress condition(s) as part of and/or during a burn-in procedure.

At 1208, a measure of stability may be determined and/or re-determined for the IC cell, such as described above with respect to 1012 in FIG. 10 and/or 1112 in FIG. 11. Alternatively, processing may proceed from 1206 to the selecting at 1114 or the configuring at 1116 in FIG. 11.

One or more features disclosed herein may be configured or implemented in, with and/or as, without limitation, a machine, a processor and memory, a computer-readable medium encoded with instructions executable by a processor, a computer system, and/or circuitry, including integrated circuitry, application specific integrated circuitry (ASIC), a domain-specific integrated circuit package, a system-on-a-chip (SOC), and/or combinations thereof.

Figure 13:
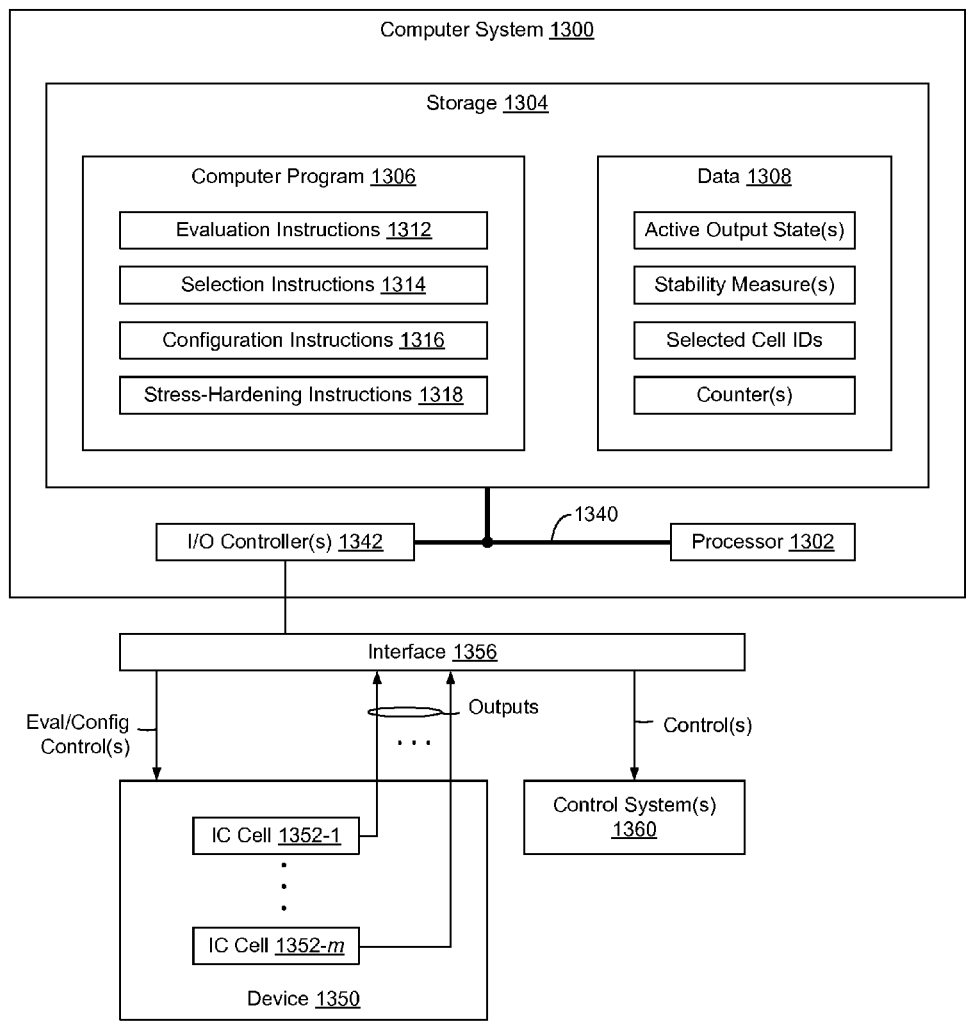
FIG. 13 is a block diagram of a computer system configured to determine measures of stability for IC cells of an IC device, select and configure a subset of the IC cells as a hardware-embedded key, and stress-harden one or more of the IC cells.

FIG. 13 is a block diagram of a computer system 1300, configured to determine measures of stability for IC cells of an IC device, and to select and configure a subset of the IC cells as a hardware-embedded key. Computer system 1300 may represent an example embodiment of an evaluation system, such as described above with respect to FIG. 7 and/or FIG. 8. Computer system 1300 is not, however, limited to the examples of FIG. 7 and/or FIG. 8.

Computer system 1300 is described below with reference to IC cells 1352 of an IC device 1350, which may be configured as described in one or more examples herein.

Computer system 1300 includes one or more computer instruction processor units and/or processor cores, illustrated here as a processor 1302, to execute instructions of a computer program 1306. Processor 1302 may include a general purpose instruction processor, a controller, a microcontroller, or other instruction-based processor.

Computer program 1306 may be encoded within a computer readable medium, illustrated here as storage 1304, which may include a non-transitory medium. Computer program 1306 may also be referred herein to as computer program logic or software.

Storage 1304 may include memory, cache, registers, a storage device, and/or other medium to store computer readable instructions. In FIG. 13, storage 1304 further includes data 1308 to be used by processor 1302 during execution of computer program 1306, and/or generated by processor 1302 during execution of computer program 1306.

Computer program 1306 includes evaluation instructions 1312 to cause processor 1302 to evaluate IC cells 1352 based on corresponding post-activation or pre-determined output states, such as described in one or more examples herein. Evaluation instructions 1312 may include instructions to cause processor 1302 to determine measures of stability for IC cells 1352, such as described in one or more examples herein.

Computer program 1306 further includes selection instructions 1314 to cause processor 1302 to select a subset of IC cells 1352 based on corresponding stability measures, such as described in one or more examples herein.

Computer program 1306 further includes configuration instructions 1316 to cause processor 1302 to configure device 1350 to generate a word or key on power-up based on pre-determined output states of the selected IC cells, such as described in one or more examples herein.

Computer program 1306 further includes stress-hardening instructions 1318 to cause processor 1302 to configure one or more IC cells 1352 for stress-hardening based on corresponding pre-determined output states, such as described in one or more examples herein. Stress-hardening instructions 1318 may include instructions to cause processor 1302 to control one or more control systems 1360 to subject IC device 1350 or a portion thereof to one or more stress conditions, such as described in one or more examples herein.

Computer system 1300 further includes communications infrastructure 1340 to communicate amongst devices and/or resources of computer system 1300.

Computer system 1300 may include one or more input/output (I/O) systems, devices, and/or controllers 1342 to interface between processor 1302 and one or more other systems, such as device 135 and/or control system(s) 1360. An I/O controller 1342 may be configured to interface with device 1350 directly and/or through another interface 1356.

Methods and systems disclosed herein may be implemented with respect to one or more of a variety of devices and/or systems, such as described below with reference to FIG. 14. Methods and systems disclosed herein are not, however, limited to the examples of FIG. 14.

Figure 14:
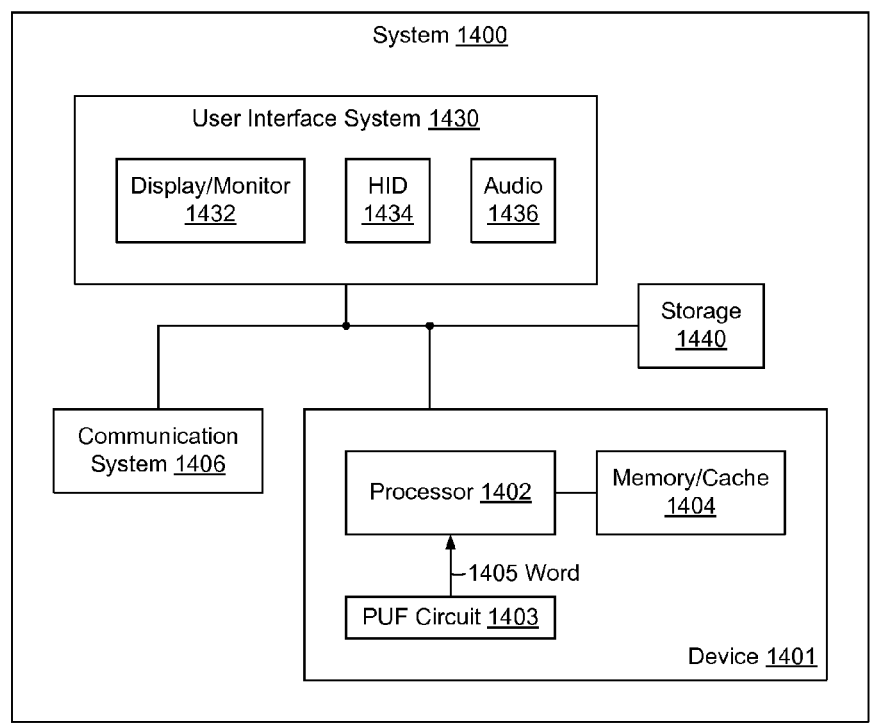
FIG. 14 is a block diagram of a system that includes a device having a processor, associated memory, and a PUF circuit to provide a key upon power-up.

FIG. 14 is a block diagram of a system 1400, including a device 1401 having a processor 1402 and associated memory, cache, and/or other storage medium, illustrated here as memory/cache 1404. Device 1401 further includes a PUF circuit 1403 to provide a digital code word 1405 upon activation, such as described with respect to one or more examples herein. Device 1401 may include an IC die, an IC chip, a chipset, a system-on-a-chip (SOC), and/or other device, and may be implemented or configured as described above with respect to device 900 in FIG. 9.

System 1400 further includes a wired and/or wireless communication system, 1406 to communicate between an external communication network and/or and one or more of processor 1402 and user interface system 1430. The external network may include a voice network (e.g., a wireless telephone network), and/or a data or packet-based network (e.g., a proprietary network and/or the Internet).

System 1400 further includes a user interface system 1430, illustrated here as including a monitor or display 1432 and a human interface device (HID) 1434. HID 1434 may include, without limitation, a key board, a cursor device, a touch-sensitive device, pad, and/or display, a motion and/or image sensor, a physical device and/or a virtual device, such as a monitor-displayed virtual keyboard. User interface system 1430 may further include an audio system 1436, which may include a microphone and/or a speaker.

System 1400 may further include an electronic or computer-readable storage medium (storage) 1440, which may be accessible to processor 1402, communication system 1406, and/or user interface system 1430.

System 1400 may be configured as a stationary or portable/hand-held system, and may be configured as, for example, a mobile telephone, a set-top box, a gaming device, and/or other device, and may include a rack-mountable, desk-top, lap-top, notebook, net-book, note-pad, tablet and/or housing configuration. System 1400 is not, however, limited to these examples.

System 1400 or portions thereof may be implemented within one or more integrated circuit die, and may be implemented as a system-on-a-chip (SoC).

Figure 15:
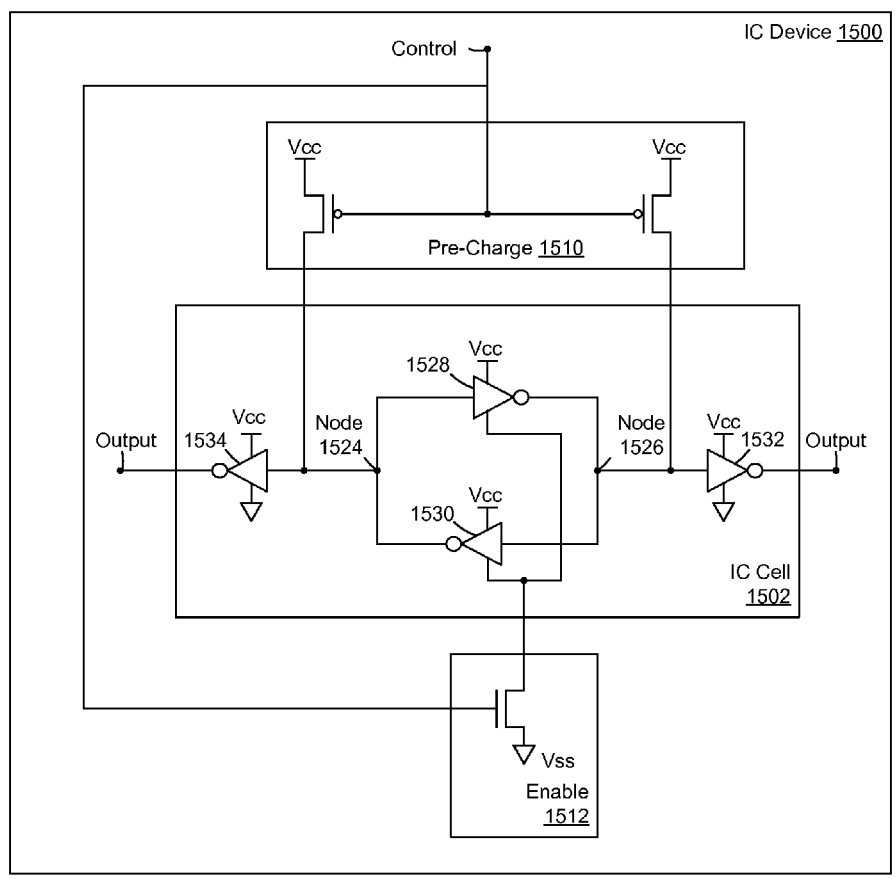
FIG. 15 is a logic diagram of another IC device that includes an IC cell having first and second cross-coupled inverters and first and second output inverters.

FIG. 15 is a logic diagram of an IC device 1500, including an IC cell 1502 having first and second cross-coupled inverters 1528 and 1530, such as described above with reference to FIG. 3. IC cell 1502 further includes first and second output inverters 1532 and 1534, one or both of which may be used to provide an output state of IC cell 1502. Where one of output inverters 1532 and 1534 is used to provide an output state of IC cell 1502, the other output inverter may be included to provide balanced loads at nodes 1524 and 1526.

IC device 1500 further includes a pre-charge module 1510 and an enable module 1512, configured as described above with respect to IC device 300 in FIG. 3 and IC device 500 in FIG. 5. In another example embodiment, pre-charge module 1510 and enable module 1512 are configured as described above with respect to IC device 400 in FIG. 4.

As disclosed herein, an IC device may be configured to self-generate a unique and persistent code or key at power-up based on random features of selected IC cells, such as random process or manufacturing variations, such that the key is unique to the combination of the random variations of the selected IC cells.

The code may be indeterminable and thus tamper resistant prior to and during manufacture. The code remains stable with age, and tolerant of instantaneous thermal noise and environmental changes, variations, and/or fluctuations, such as voltage and temperature variations. The IC cells may be stress-hardened to increase stability and tolerance.

The code may be utilized as, for example and without limitation, a Platform Root Key, a High-Bandwidth Digital Content Protection (HDCP) key for display protection, an Enhanced Privacy Identification (EPID) key for anonymous attestation of hardware devices, and an Advanced Access Content System (AACS) key for media content protection.

EXAMPLES

The following examples pertain to further embodiments.

Example 1 is method that may be employed to operate, evaluate, stress-harden, and/or configure an integrated circuit (IC) device that includes a first IC cell designed to resolve from an unstable output state to any one of multiple output states with equal probability upon activation.

Example 1 includes activating the first IC cell, which includes pre-charging the first IC cell to an unstable output state and enabling the first IC cell to resolve from the unstable output state to a pre-determined one of the multiple output states, where the pre-determined output state is determined by random variations within the IC device.

In an Example 2, the first IC cell of Example 1 includes first and second devices to control the output state of the first IC cell.

In an Example 3, the first and second devices of Example 2 are designed to have identical relative strengths.

In an Example 4, the relative strengths of the first and second devices of Example 3 differ from one another due to the random variations;

In an Example 5, the output state of the first IC cell of Example 4 is determined by a stronger one of the first and second devices.

In an Example 6, the pre-charging of any one of the preceding Examples includes pre-charging a node of each of first and second devices of the first IC cell to states that are incompatible with one another, and the enabling of any preceding Example includes enabling the first and second devices to resolve one of the nodes to a state that is compatible with the pre-charge state of the other node.

In an Example 7, further to Example 6: the first and second devices of include first and second corresponding inverters, each having an input to receive an output of the other; the pre-charging includes pre-charging the outputs of the first and second inverters to a same pre-charge state; and the enabling includes enabling the first and second inverters to resolve the output of one of the first and second inverters to an opposite state of the pre-charge state.

In an Example 8, the method of any one of the preceding Examples further includes determining a measure of stability for the first IC cell based on post-activation output states of the first IC cell.

In an Example 9, the method of Example 8 includes determining the measure of stability with respect to a range of one or more of operating voltage and a temperature of the first IC.

In an Example 10, the method of any one of the preceding Examples includes: for each of n activations of the IC cell, incrementing a count if the corresponding output state corresponds to a first logic state, and maintaining the count if the output state corresponds to a second logic state; determining a difference between the count and n, after the n activations of the first IC cell; and determining a measure of stability for the IC cell based on the difference.

In an Example 11, the method of any one of the preceding Examples includes: determining an indirect measure of a difference in relative strengths of first and second devices of the first IC cell based on the post-activation output states of the first IC cell; and determining a measure of stability for the first IC cell based on the indirect measure of the difference in relative strengths.

In an Example 12, the method of any one of the preceding Examples includes: determining an indirect measure of a difference between voltage transfer curves of first and second devices of the first IC cell based on post-activation output states of the first IC cell over the multiple activations; and determining a measure of stability for the first IC cell based on the indirect measure of the difference between the voltage transfer curves In an Example 13, the method of any one of the preceding Examples includes: controllably delaying the enabling of one of the first and second devices relative to the other; and determining a measure of stability for the first IC cell based on a delay for which the post-activation output state of the first IC cell changes from the pre-determined output state to another state.

In an Example 14, with respect to of any one of the preceding Examples, the first IC cell includes first and second controllable delay elements, each to delay enabling of a corresponding one of the first and second devices, and the method further includes: selecting one of the first and second delay elements based on the pre-determined output state of the first IC cell; controlling the selected delay element based on a count; and determining a measure of stability for the first IC cell based on a count for which a post-activation output state of the first IC cell differs from the pre-determined output state.

In an Example 15, the method of any one of the preceding Examples includes stress-hardening the first IC cell.

In an Example 16, the method of Example 15 includes stress-hardening the first IC cell to improve stability of the first IC cell.

In an Example 17, the method of Example 15 or Example 16 includes stress-hardening the first IC cell to increase tolerance of the first IC cell with respect to an environmental change.

In an Example 18, the method of any one of Examples 15-17 includes stress-hardening the first IC cell to increase tolerance of the first IC cell with respect to instantaneous thermal noise.

In an Example 19, the method of any one of Examples 15-18 includes configuring the first IC cell to assert an output state other than the pre-determined output state while a stress-condition is applied to the first IC cell.

In an Example 20, the method of any one of Examples 15-19 includes configuring the first IC cell to turn-on a weaker one of first and second devices of the first IC cell and to turn-off a stronger one of the first and second devices of the first IC cell while a stress-condition is applied to the first IC cell.

In an Example 21, the method of any one of Examples 15-20 includes stress-hardening the first IC cell to increase a difference in relative strengths of first and second devices of the first IC cell.

In an Example 22, the method of any one of Examples 15-21 includes stress-hardening the first IC cell to further weaken a weaker one of first and second devices of the first IC cell.

In an Example 23, the method of any one of Examples 15-22 includes configuring the first IC cell to cause a weaker one of the first and second device to determine the output state of the first IC cell while the first IC cell is subjected to a stress-condition.

In an Example 24, the IC device of any one of the preceding Examples includes an array of IC cells, including the first IC cell, and the method further includes: selecting a subset of the IC cells based on corresponding measures of stability; and configuring the IC device to provide pre-determined output states of the selected subset of IC cells as a key upon activation of the selected IC cells.

In an Example 25, the key of Example 24 is unique to the IC device due to a combination of the random variations of the IC device and the selected the IC cells.

In an Example 26, the method of Example 24 or Example 25 includes using the key as a Platform Root Key, a High-Bandwidth Digital Content Protection (HDCP) key, an Enhanced Privacy Identification (EPID) key, and/or an Advanced Access Content System (AACS) key.

In an Example 27, at least one machine readable medium includes a plurality of instructions that in response to being executed on a computing device, cause the computing device to perform the method according to any one of Examples 1-26.

In an Example 28, a machine readable storage medium includes machine-readable instructions for performing the method of any one of Examples 1-26 when executed on a machine.

An Example 29 is an apparatus configured to perform the method of any one of Examples 1-26.

An Example 30 is a computer system to perform the method of any one of Examples 1-26.

An Example 31 is a machine to perform the method of any of Examples 1-26.

An Example 32 is an apparatus having means for performing the method of any one of Examples 1-26.

An Example 33 is a computing device comprising a chipset according to any one of the Examples 1-26, and memory to evaluate, stress-harden, and/or configure an IC cell.

Any one of Examples 27-33 may be implemented to activate an IC cell, determine a measure of stability of one or more IC cells, stress-harden one or more IC cells, select a subset of multiple IC cells, and/or configure the IC device to provide a key based on pre-determined output states of multiple IC cells of the IC device.

An Example 34 is an integrated circuit (IC) device having a first IC cell to assert a pre-determined one of multiple output states according to any one of Examples 1-26.

In an Example 35, the IC device of Example 34 includes control circuitry to implement the pre-charging and the enabling according to any one of Examples 1-26.

An Example 36 is a system that includes an integrated circuit (IC) device having an array of IC cells, each designed to resolve from an unstable output state to any one of multiple stable output states with equal probability upon activation, and control circuitry to activate the IC cells.

The IC device of Example 36 further includes pre-charge circuitry to pre-charge each of the IC cells to the unstable output state and enable circuitry to enable each of the IC cells to resolve from the unstable output state to a corresponding pre-determined one of the multiple stable output states, where the pre-determined output states are determined by random variations within the IC device.

The IC device of Example 36 is configured to provide the pre-determined output states of a sub-set of the IC cells as a key upon activation of the selected sub-set of IC cells.

The system of Example 36 further includes a processor and memory to receive the key from the IC device.

In an Example 37, the system of Example 36 further includes a user interface to present information from the processor, and a communication system to interface between a communication network and one or more of the processor and the user interface.

In an Example 38, the system of Example 36 or Example 37 is configured as a portable telephone.

In an Example 39, the system of Example 36 or Example 37 is configured as a portable computer system.

In an Example 40, the processor and memory of any one of Examples 36-39 are configured to use the key as a Platform Root Key, a High-Bandwidth Digital Content Protection (HDCP) key, an Enhanced Privacy Identification (EPID) key, and/or an Advanced Access Content System (AACS) key.

An Example 41 is an integrated circuit (IC) device that includes: a first IC cell designed to resolve from an unstable output state to one of multiple stable output states with equal probabilities upon activation; and first control circuitry to activate the first IC cell, including to pre-charge the first IC cell to the unstable output state, and to enable the first IC cell to resolve from the unstable output state to a pre-determined one of the multiple stable output states; where the pre-determined output state is determined by random variations within the IC device.

In an Example 42, further to Example 41: the first IC cell includes first and second devices to control the output state of the first IC cell; the first and second devices are designed to have identical relative strengths; the relative strengths of the first and second devices differ from one another due to the random variations; and the output state of the first IC cell is determined by a stronger one of the first and second devices.

In an Example 43, the first control circuitry of Example 42 includes: a pre-charge module to pre-charge a node of each of the first and second devices to states that are incompatible with one another; and an enable module to enable the first and second devices to permit one of the nodes to resolve to a state that is compatible with the pre-charge state of the other node.

In an Example 44, the first IC cell of any one of Examples 41-43 is stress-hardened to increase tolerance of the first IC cell to one or more an environmental changes and instantaneous thermal noise.

In an Example 45, the IC device of any one of Examples 41-44 includes an array of IC cells and corresponding control circuitry, including the first IC cell and the first control circuitry, and the IC device is configurable to provide pre-determined output states of a selectable subset of the IC cells as a key upon activation of the selected IC cells.

An Example 46 is a system to evaluate integrated circuitry, including an evaluation module to determine a measure of stability for a first IC cell of an IC device based on post-activation output states of the first IC cell. In Example 44, the IC device includes first control circuitry to activate the first IC cell, including to pre-charge the first IC cell to an unstable output state, and to enable the first IC cell to resolve from the unstable output state to a pre-determined one of multiple stable output states. Further in Example 44, the first IC cell is designed to resolve from the unstable output state to any of the multiple stable output states with equal probability upon activation, and the pre-determined output state is determined by random variations within the IC device.

In an Example 47, the evaluation module of Example 46 includes: a counter to increment a count if the post-activation output state corresponds to a first logic state, and to maintain the count if the post-activation output state corresponds to a second logic state; a comparator to determine a difference between the count and n, after n activations of the first IC cell; and a decision module to determine the measure of stability based on the difference.

In an Example 48, the evaluation module of Example 46 or Example 47 is configured to controllably delay enablement of one of first and second devices of the first IC cell relative to the other, and to determine a measure of stability for the first IC cell based on a delay for which the post-activation output state of the first IC cell changes from the pre-determined output state to another state.

In an Example 49, the system of any one of Examples 46-48 includes a stress-hardening module to configure the first IC cell to assert an output state other than the pre-determined output state while a stress-condition is applied to the first IC cell.

In an Example 50, the system of any one of Examples 46-49 includes a stress-hardening module to configure the first IC cell to turn-on a weaker one of first and second devices of the first IC cell and to turn-off a stronger one of the first and second devices, while a stress-condition is applied to the first IC cell.

In an Example 51, the IC device of any one of Examples 46-49 includes an array of IC cells and corresponding control circuitry, including the first IC cell and the first control circuitry, and the evaluation system is configured to determine measures of stability for the multiple IC cells, select a subset of the IC cells based on corresponding measures of stability, and configure the IC device to provide pre-determined output states of the selected subset of IC cells as a key upon activation of the selected IC cells.

An Example 52 is a non-transitory computer-readable medium encoded with a computer program, including evaluation instructions to cause a processor to determine a measure of stability for a first IC cell of an IC device based on post-activation output states of the first IC cell. In Example 52, the IC device includes first control circuitry to activate the first IC cell, including to pre-charge the first IC cell to an unstable output state, and to enable the first IC cell to resolve from the unstable output state to a pre-determined one of multiple stable output states. Further in Example 52, the first IC cell is designed to resolve from the unstable output state to any of the multiple stable output states with equal probability upon activation, and the pre-determined output state is determined by random variations within the IC device.

In an Example 53, the evaluation instructions of Example 52 include instructions to cause the processor to: for each of n activations of the IC cell, increment a count if the corresponding output state corresponds to a first logic state, and maintain the count if the output state corresponds to a second logic state; determine a difference between the count and n, after the n activations of the first IC cell; and determine a measure of stability for the IC cell based on the difference.

In an Example 54, the evaluation instructions of Example 52 or Example 53 include instructions to cause the processor to: controllably delay the enabling of one of the first and second devices relative to the other; and determine a measure of stability for the first IC cell based on a delay for which the post-activation output state of the first IC cell changes from the pre-determined output state to another state.

In an Example 55, the computer-readable medium of any one of Examples 52-54 include stress-hardening instructions to cause the processor to configure the first IC cell to assert an output state other than the pre-determined output state while a stress-condition is applied to the first IC cell.

In an Example 56, the computer-readable medium of any one of Examples 52-55 includes stress-hardening instructions to cause the processor to configure the first IC cell to turn-on a weaker one of first and second devices of the first IC cell and to turn-off a stronger one of the first and second devices while a stress-condition is applied to the first IC cell.

In an Example 57, the IC device of any one of Examples 52-56 includes an array of IC cells, including the first IC cell, and the instructions include instructions to cause the processor to: selecting a subset of the IC cells based on corresponding measures of stability; and configure the IC device to provide pre-determined output states of the selected subset of IC cells as a key upon activation of the selected IC cells.

Methods and systems are disclosed herein with the aid of functional building blocks illustrating functions, features, and relationships thereof. At least some of the boundaries of these functional building blocks have been arbitrarily defined herein for the convenience of the description. Alternate boundaries may be defined so long as the specified functions and relationships thereof are appropriately performed. While various embodiments are disclosed herein, it should be understood that they are presented as examples. The scope of the claims should not be limited by any of the example embodiments disclosed herein.

What is claimed is:

1. A method, comprising:
   repeatedly activating a first integrated circuit (IC) cell of an IC device, wherein the first IC cell is designed to resolve from an unstable output state to any one of multiple output states with equal probability, and wherein the activating includes,
   pre-charging the first IC cell to the unstable output state, and
   enabling the first IC cell to resolve from the unstable output state to one of the multiple output states based on random variations within the IC device; and
   determining a measure of stability for the first IC cell based on the post-activation output states of the first IC cell.

2. The method of claim 1, wherein the computing includes:
   for each of n activations of the first IC cell, incrementing a count if the corresponding output state corresponds to a first logic state, and maintaining the count if the output state corresponds to a second logic state;
   determining a difference between the count and n, after the n activations of the first IC cell; and
   computing the measure of stability for the first IC cell based on the difference.

3. The method of claim 1, wherein the first IC cell includes first and second devices, and wherein:
   the pre-charging includes pre-charging outputs of the first and second devices to states that are incompatible with one another,
   the enabling includes delaying enabling of one of the first and second devices relative to the other one of the first and second devices;
   the method further includes identifying a first one of the multiple post-activation output states as a pre-determined output state of the first IC cell based on the post-activation output states of the first IC cell, wherein the pre-detemnned output state of the first IC cell depends on variations within the IC device; and
   the computing includes computinq the measure of stability for the first IC cell based on a delay for which the post-activation output state of the first IC cell changes from the pre-determined output state to another one of the multiple post-activation output states.

4. The method of claim 3, further including:
   stress programming the first IC cell to change the pre-determined output state to another one of the post-activation output states.

5. The method of claim 4, wherein the stress programming includes:
   configuring the first IC cell to turn-on a weaker one of first and second devices and to turn-off a stronger one of the first and second devices while a stress-condition is applied to the first IC cell.

6. The method of claim 1, wherein the IC device includes an array of IC cells, including the first IC cell, the method further including:
   selecting a subset of the IC cells based on corresponding measures of stability;
   for each IC cell of the subset, identifying one of the multiple post-activation output states as a pre-determined output state of the respective IC cell based on the post-activation output states of the respective IC cell, wherein the predetermine output states of the subset of IC cells is determined by the random variations within the IC device; and
   configuring the IC device to provide the pre-determined output states of the subset of IC cells as a key upon activation of the subset of IC cells.

7. An integrated circuit (IC) device, comprising:
   an array of IC cells, each designed to resolve from an unstable output state to one of multiple post-activation output states with equal probability upon activation; and
   control circuitry to activate the IC cells, including to pre-charge the IC cells to the unstable output state, and to enable each of the IC cells to resolve from the unstable output state to a pre-determined one of the multiple post-activation stable output states, wherein the pre-determined post-activation output states of the IC cells are determined by random variations within the IC device;

wherein the IC device is configured to provide the pre-determined post-activation output states of the IC cells as a key.

8. The IC device of claim 7, wherein:

the a first one of the IC cells includes first and second devices to control an output of the first IC cell;

the first and second devices are designed to have identical strengths;

the strengths of the first and second devices differ from one another due to the random variations within the IC device; and the pre-determined post-activation output state of the first IC cell is determined by a stronger one of the first and second devices.

9. The IC device of claim 8, wherein the control circuitry is configured to:

pre-charge a node of each of the first and second devices to states that are incompatible with one another; and enable the first and second devices to permit the node of one of the first and second devices to resolve to a state that is compatible with the node of the other one of the first and second devices.

10. The IC device of claim 7, wherein the first IC cell is stress-hardened to increase tolerance of the IC cells to one or more an environmental changes and instantaneous thermal noise.

11. A system, comprising:

an evaluation module to determine a measure of stability for a first IC cell of an IC device based on post-activation output states of the first IC cell;

wherein the IC device includes first control circuitry to activate the first IC cell, including to pre-charge the first IC cell to an unstable output state, and to enable the first IC cell to resolve from the unstable output state to a pre-determined one of multiple stable output states; and wherein the first IC cell is designed to resolve from the unstable output state to any of the multiple stable output states with equal probability upon activation, and wherein the pre-determined output state is determined by random variations within the IC device.

12. The system of claim 11, wherein the evaluation module includes:

a counter to increment a count if the post-activation output state corresponds to a first logic state, and to maintain the count if the post-activation output state corresponds to a second logic state;

a comparator to determine a difference between the count and n, after n activations of the first IC cell; and a decision module to determine the measure of stability based on the difference.

13. The system of claim 11, wherein the evaluation module is configured to controllably delay enablement of one of first and second devices of the first IC cell relative to the other, and to determine a measure of stability for the first IC cell based on a delay for which the post-activation output state of the first IC cell changes from the pre-determined output state to another state.

14. The system of claim 11, further including a stress-hardening module to configure the first IC cell to assert an output state other than the pre-determined output state while a stress-condition is applied to the first IC cell.

15. The system of claim 11, further including a stress-hardening module to configure the first IC cell to turn-on a weaker one of first and second devices of the first IC cell and to turn-off a stronger one of the first and second devices, while a stress-condition is applied to the first IC cell.

16. The system of claim 11, wherein the IC device includes an array of IC cells and corresponding control circuitry, including the first IC cell and the first control circuitry, and wherein the evaluation system is configured to, determine measures of stability for the multiple IC cells, select a subset of the IC cells based on corresponding measures of stability, and configure the IC device to provide pre-determined output states of the selected subset of IC cells as a key upon activation of the selected IC cells.

17. A non-transitory computer-readable medium encoded with a computer program, including evaluation instructions to cause a processor to:

determine a measure of stability for a first IC cell of an IC device based on post-activation output states of the first IC cell;

wherein the IC device includes first control circuitry to activate the first IC cell, including to pre-charge the first IC cell to an unstable output state, and to enable the first IC cell to resolve from the unstable output state to a pre-determined one of multiple stable output states; and wherein the first IC cell is designed to resolve from the unstable output state to any of the multiple stable output states with equal probability upon activation, and wherein the pre-determined output state is determined by random variations within the IC device.

18. The computer-readable medium of claim 17, wherein the evaluation instructions include instructions to cause the processor to:

for each of n activations of the IC cell, increment a count if the corresponding output state corresponds to a first logic state, and maintain the count if the output state corresponds to a second logic state;

determine a difference between the count and n, after the n activations of the first IC cell; and determine a measure of stability for the IC cell based on the difference.

19. The computer-readable medium of claim 17, wherein the evaluation instructions include instructions to cause the processor to:

controllably delay the enabling of one of the first and second devices relative to the other; and determine a measure of stability for the first IC cell based on a delay for which the post-activation output state of the first IC cell changes from the pre-determined output state to another state.

20. The computer-readable medium of claim 17, further including stress-hardening instructions to cause the processor to:

configure the first IC cell to assert an output state other than the pre-determined output state while a stress-condition is applied to the first IC cell.

21. The computer-readable medium of claim 17, further including stress-hardening instructions to cause the processor to:

configure the first IC cell to turn-on a weaker one of first and second devices of the first IC cell and to turn-off a stronger one of the first and second devices while a stress-condition is applied to the first IC cell.

22. The computer-readable medium of claim 17, wherein the IC device includes an array of IC cells, including the first IC cell, further including instructions to cause the processor to:

selecting a subset of the IC cells based on corresponding measures of stability; and configure the IC device to provide pre-determined output states of the selected subset of IC cells as a key upon activation of the selected IC cells.

23. A system, comprising:
an integrated circuit (IC) device, including,
   an array of IC cells, each designed to resolve from an unstable output state to any one of multiple stable output states with equal probability upon activation, and
   control circuitry to activate the IC cells, including pre-charge circuitry to pre-charge each of the IC cells to the unstable output state and enable circuitry to enable each of the IC cells to resolve from the unstable output state to a corresponding pre-determined one of the multiple stable output states,
   wherein the pre-determined output states are determined by random variations within the IC device, and
   wherein the IC device is configured to provide the pre-determined output states of a sub-set of the IC cells as a key upon activation of the selected sub-set of IC cells; and
a processor and memory to receive the key from the IC device.

24. The system of claim 23, further including:
a user interface to present information from the processor; and
a communication system to interface between a communication network and one or more of the processor and the user interface.

25. The system of claim 24 configured as a portable telephone.

26. The system of claim 24, configured as a portable computer system.

27. The system of claim 24, wherein the processor and memory are configured to use the key as one or more of,
   a Platform Root Key,
   a High-Bandwidth Digital Content Protection (HDCP) key,
   an Enhanced Privacy Identification (EPID) key, and
   and an Advanced Access Content System (AACS) key.

* * * * *